(12) United States Patent
Takami

(10) Patent No.: US 7,859,926 B2
(45) Date of Patent: Dec. 28, 2010

(54) SEMICONDUCTOR MEMORY DEVICE

(75) Inventor: Shinya Takami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 40 days.

(21) Appl. No.: 12/418,200

(22) Filed: Apr. 3, 2009

(65) Prior Publication Data

US 2009/0251980 A1     Oct. 8, 2009

(30) Foreign Application Priority Data

Apr. 3, 2008     (JP) ............................. 2008-097272

(51) Int. Cl.
*G11C 7/00*     (2006.01)
(52) U.S. Cl. ............. 365/203; 365/189.02; 365/189.03; 365/189.15; 365/189.05; 365/233.17; 365/204
(58) Field of Classification Search ............ 365/189.02, 365/189.03, 189.15, 189.05, 203, 204, 233.17
See application file for complete search history.

(56) References Cited

U.S. PATENT DOCUMENTS

| | | | |
|---|---|---|---|
| 7,289,376 B2 * | 10/2007 | Chang et al. ........... | 365/189.06 |
| 7,362,623 B2 * | 4/2008 | Honma et al. .......... | 365/189.09 |
| 7,411,850 B2 * | 8/2008 | Higashi et al. ........... | 365/210.1 |
| 7,453,758 B2 * | 11/2008 | Hoffmann ............... | 365/230.04 |
| 7,599,237 B2 * | 10/2009 | Jung et al. .................. | 365/203 |
| 2006/0171240 A1 * | 8/2006 | Combe .................. | 365/230.06 |
| 2009/0086524 A1 * | 4/2009 | Alam et al. .................... | 365/94 |

FOREIGN PATENT DOCUMENTS

JP          7-78489          3/1995

* cited by examiner

*Primary Examiner*—Hoai V Ho
*Assistant Examiner*—Fernando N Hidalgo
(74) *Attorney, Agent, or Firm*—Young & Thompson

(57) ABSTRACT

Disclosed is a semiconductor memory device including a discharge circuit that discharges bit lines to a ground potential, a sense amplifier of a single-ended input configuration, and a charging transistor connected between a power supply and an input node of the sense amplifier. The charging transistor charges a bit line from a side of the input node of the sense amplifier via the selected column select transistor which is set to an on state. When a current path to the ground from the bit line to which a selected memory cell is connected is turned off at a time of reading, the input node of the sense amplifier is charged by the charging transistor, and a potential at the input node of the sense amplifier is thereby raised. Then, after the input node of the sense amplifier has been further charged with the one of the column select transistors turned off, the reading operation is performed.

13 Claims, 8 Drawing Sheets

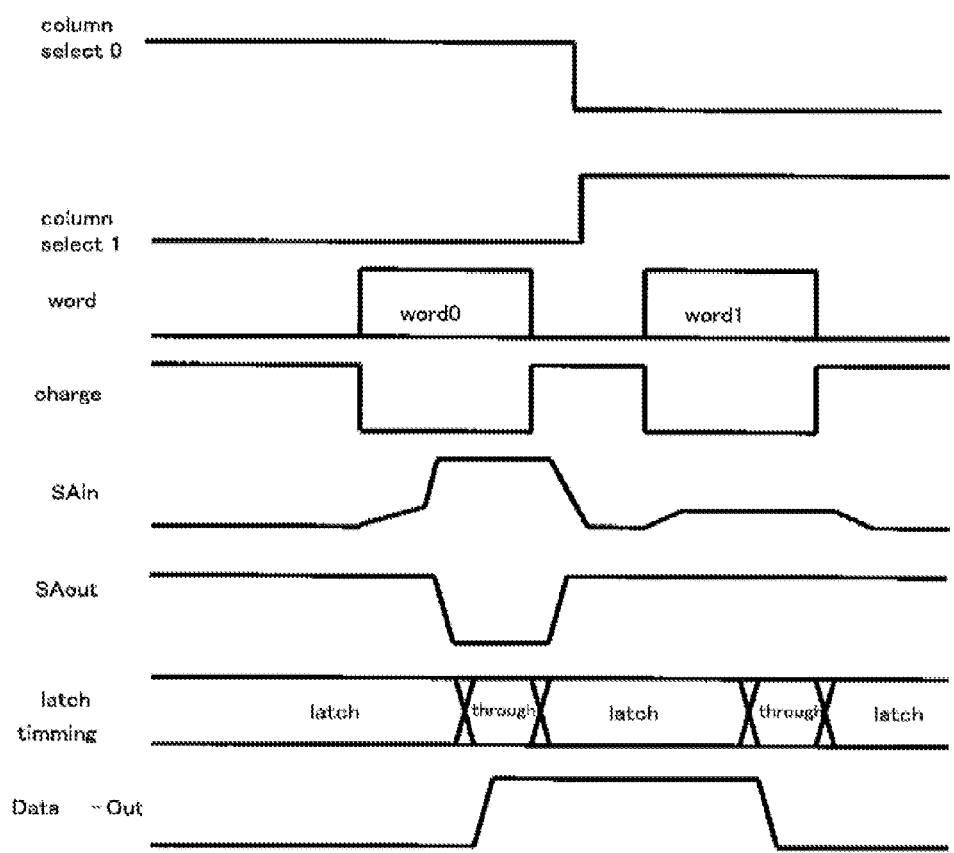

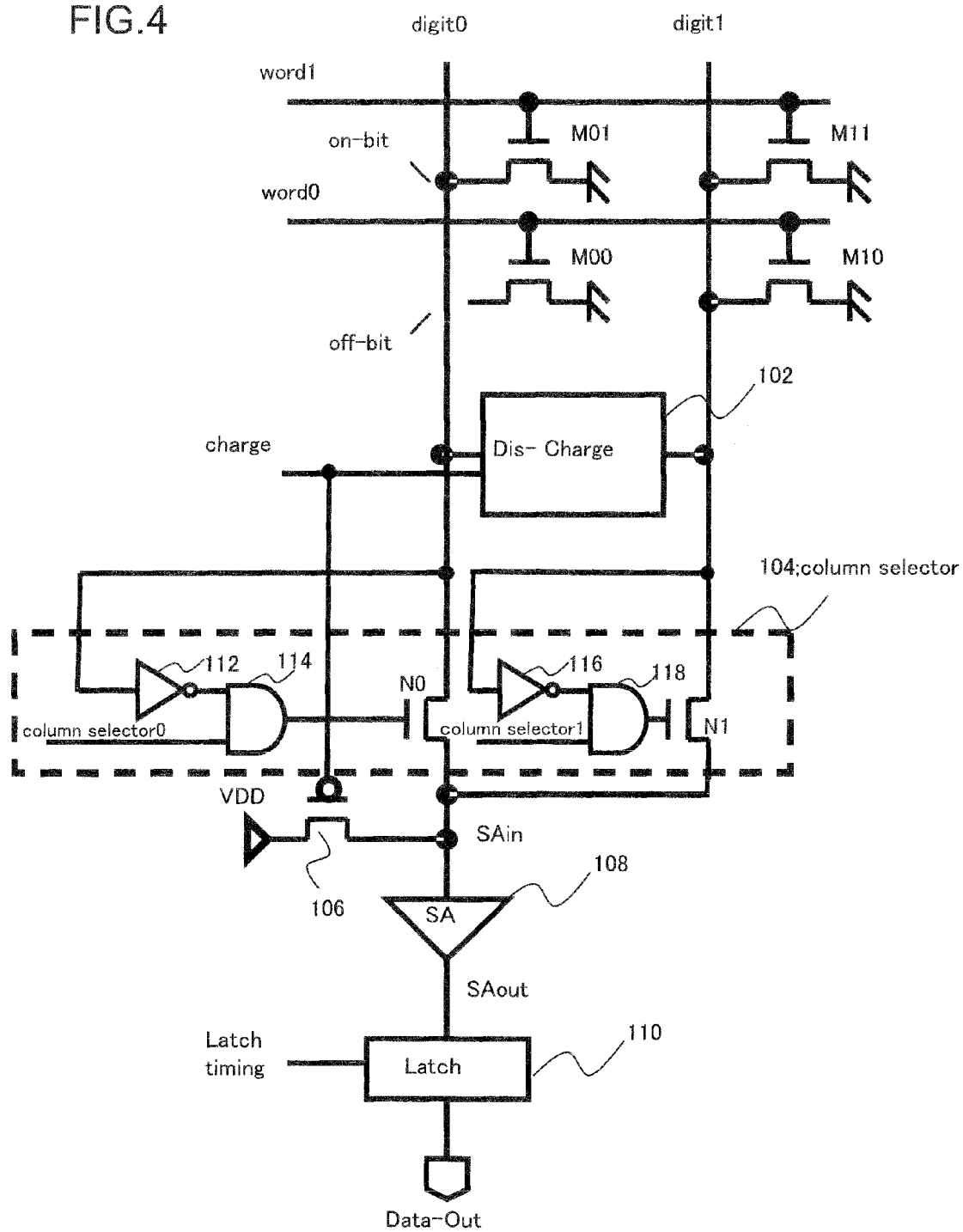

SEMICONDUCTOR MEMORY DEVICE

REFERENCE TO RELATED APPLICATION

This application is based upon and claims the benefit of the priority of Japanese patent application No. 2008-097272, filed on Apr. 3, 2008, the disclosure of which is incorporated herein in its entirety by reference thereto.

TECHNICAL FIELD

The present invention relates to a semiconductor memory. More specifically, the invention relates to a read circuit.

BACKGROUND

A semiconductor memory circuit (such as in Patent Document 1) is known in which bit lines are discharged to a ground potential before data is read from a memory cell is read, and a corresponding bit line is charged to a power supply potential at a time of reading data from the memory cell and data on the selected bit line is amplified by a sense amplifier. By discharging the bit lines to the ground (GND) potential, a drain-to-source leakage current in the memory cell including a cell transistor which has a drain connected to the corresponding bit line, can be restrained. FIG. 7 shows a configuration example of the semiconductor memory device disclosed in Patent Document 1. FIG. 7 shows ROM (Read Only Memory) memory cells and a read circuit of the ROM memory cells. Referring to FIG. 7, there are memory cells each including an NMOS transistor 1 which has a source electrode grounded, a drain electrode connected to a bit line, and a gate electrode connected to a word line, and memory cells each including an NMOS transistors 2 which has a floating source electrode, a drain electrode connected to a bit line, and a gate electrode connected to a word line. Each of dummy memory cells 3 which are replicas of the memory cells, has a source electrode grounded, a drain electrode connected to a bit line, and a gate electrode connected to a word line.

FIG. 8 is a timing chart showing a read operation of the semiconductor memory device in FIG. 7. In a time interval during which a signal RST is High, all bit lines B0 to Bn and a dummy bit line BD are discharged to a GND level through bit line discharging transistors 6. When the signal RST goes Low, the discharging transistors 6 are turned off. Next, one word line is selected by a row decoder 9, and goes High. Then, all the memory cells and one of the dummy cells 3 connected to the selected word line are turned on. A column select signal C0 goes High, the bit line B0 is connected to an input of a differential amplification sense amplifier circuit 18, and a signal PCR goes Low. Then, only a pair of the bit line B0 and the dummy bit line BD is charged through bit line charging transistors 5. In this case, when the source electrode of the selected memory cell is grounded (in the case of the memory cells 1), a potential at the bit line B0 is determined by a conductance ratio between the memory cell 1 and a bit line charging transistor 5. A potential at the dummy bit line BD that forms a pair with the bit line B0 is determined by a conductance ratio between the dummy cell 3 and a bit line charging transistor 5. Ordinarily, the conductance of the dummy memory cell 3 is set to be a half of that of the memory cell 1. Thus, the potential at the dummy bit line BD connected the dummy memory cell 3 is approximately doubled from the potential at the bit line B0 connected to the memory cell 1. Then, a potential difference is generated between inputs D and DDY of the differential amplification sense amplifier 18.

When the source electrode of the selected memory cell is floating (in the case of the memory cell 2), no current path is present. Thus, the bit line B0 is charged through the bit line charging transistor 5. In this case as well, a potential at the dummy bit line BD connected to the dummy memory cell 3 assumes a potential determined by the conductance ratio. Thus, the potential at the dummy bit line BD becomes lower than the potential at the bit line B0 to which the memory cell 2 is connected. For this reason, a potential difference is generated between the inputs D and DDY of the differential amplification sense amplifier circuit 18. The potential at the dummy bit line BD connected to the dummy memory cell 3 generates an intermediate reference potential between High and Low bit line potentials of an ordinary memory cell. Next, an enable signal SE goes High, the differential amplification sense amplifier circuit 18 is activated, an input minute potential difference is amplified, and data is output from an output buffer 19. As described above, the semiconductor memory circuit in FIG. 7 provides a reference signal that is intermediate between a read "1" and a read "0" using the dummy memory cell 3, and then amplifies a minute difference potential by the differential sense amplifier circuit 18, thereby performing a read operation.

As shown in FIG. 8, at a time of reading, the bit lines and the dummy bit line are first discharged to the GND potential. Then, a selected bit line and the dummy bit line are charged through the bit line charging transistors. Then, using a potential at the dummy bit line as a reference, differential amplification is performed by the differential amplification sense amplifier circuit 18.

[Patent Document 1]
JP Patent Kokai Publication No. JP-A-07-078489

SUMMARY

The disclosure of the above Patent Document 1 is incorporated herein by reference thereto.

An analysis of a related art by the present invention will be given below.

The related art (Patent Document 1) described with reference to FIGS. 7 and 8 has a configuration in which the dummy memory cells and the dummy bit line for the dummy memory cells are disposed, and the differential type sense amplifier (for differential transmission) is included. The area of the related art is therefore increased.

A difference potential between read data on a bit line and dummy data (reference potential) on the dummy bit line is minute. Thus, in order to increase a read speed, a circuit configuration in which the minute difference potential is amplified at high speed is needed.

Further, in order to avoid an erroneous latch (latch malfunction) in a differential latch type sense amplifier, it is necessary to secure an operational margin.

Further, in case of a configuration including a current mirror circuit as a load of a differential pair in a differential latch type sense amplifier, power dissipation markedly increases.

The invention, which seeks to solve one or more of the problems described above, is summarized as follows.

According to one aspect of the present invention, there is provided a semiconductor memory device comprising:

a plurality of word lines and a plurality of bit lines;

a plurality of memory cells arranged at intersections of the bit lines and the word lines;

a plurality of column select transistors having first terminals thereof connected to the plurality of bit lines, respectively, having second terminals thereof coupled in common, and having control terminals thereof respectively supplied with a plurality of column select signals, each column select transistor being controlled to be turned on and off by associated column select signal;

a sense amplifier having an input node connected to the commonly coupled second terminals of the column select transistors;

a discharge circuit that discharges the plurality of bit lines responsive to a control signal supplied thereto; and a charge circuit that has an output connected to the input node of the sense amplifier and, responsive to the control signal charges the bit line via the column select transistor which is selected and turned on. The plurality of bit lines are discharged to a ground potential by the discharge circuit in a predetermined time interval different from a time interval during which a selected word line is activated.

In a read operation of the memory cell, the bit line connected to a selected memory cell is charged from a side of an input node of the sense amplifier by the charge circuit via the column select transistor that is turned on, and when the input node of the sense amplifier and the bit line are charged by the charge circuit to a predetermined potential, the selected column select transistor that connects the bit line connected to the selected memory cell to the input node of the sense amplifier is turned off. Then after, the input node of the sense amplifier is charged by the charge circuit with the selected column select switch being turned off and with the bit line connected to the memory cell electrically disconnected from the input node of the sense amplifier, and the reading is performed by the sense amplifier, based on a result of the charging of the input node thereof. In the present invention, the sense amplifier has a single-ended input configuration.

According to the present invention, the single-ended sense amplifier allows high-speed reading. The need for dummy memory cells provided in a related art is thereby eliminated. The circuit area is reduced, and power dissipation is reduced.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 3 is a timing waveform diagram explaining the operation of the present invention;

FIG. 4 is a diagram showing a configuration of another exemplary embodiment of the present invention;

PREFERRED MODES

Figure 1:
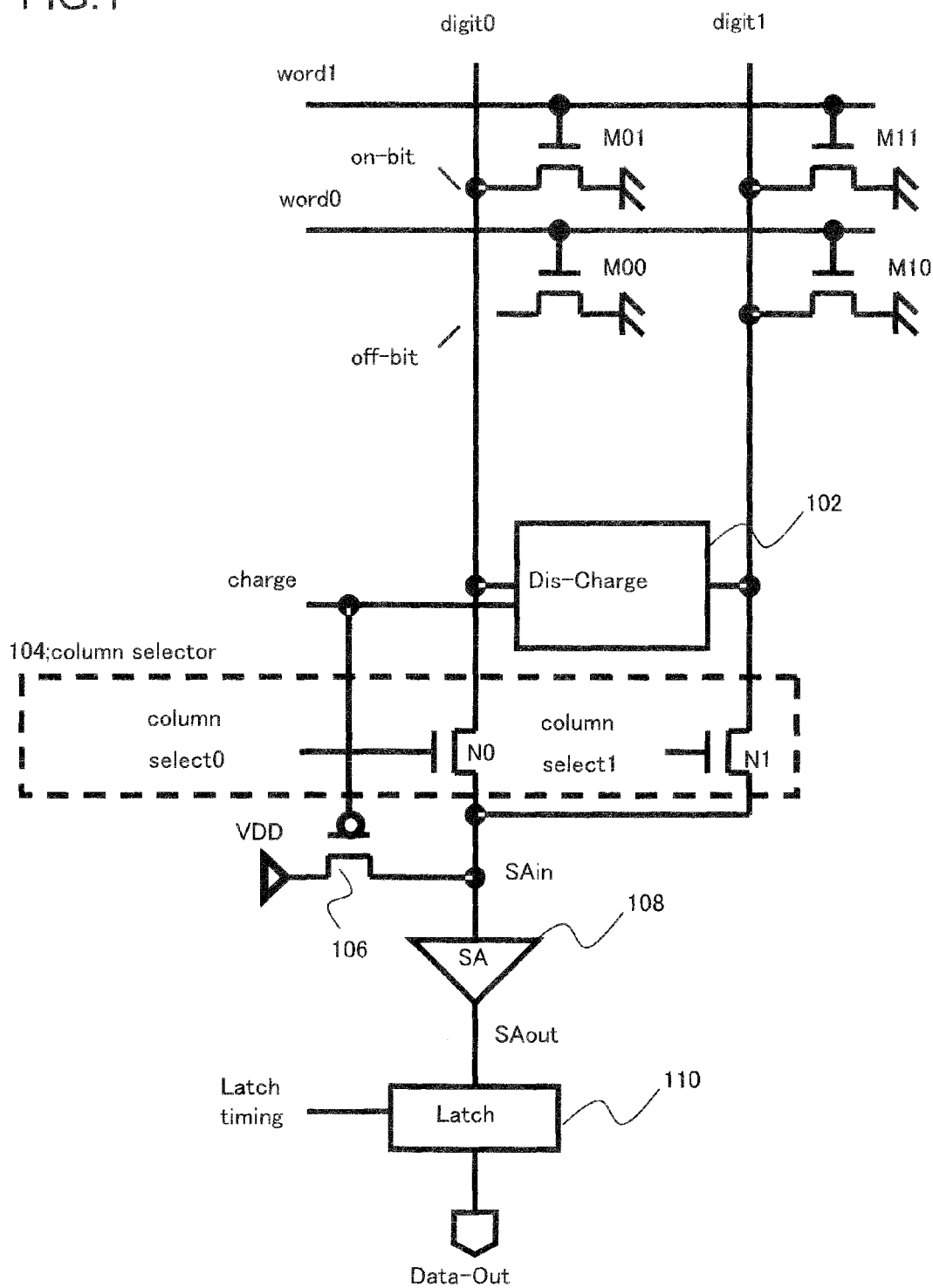
FIG. 1 is a diagram showing a configuration of an exemplary embodiment of the present invention.

The present invention will be described below with reference to drawings. In the semiconductor memory device according to one mode of the present invention, there are provided a discharge circuit (102) that discharges bit lines to a ground potential based on a control signal, a sense amplifier (108) of a single-ended input configuration, and a charge circuit (106) that charges a bit line from an input side node of the sense amplifier via a column select transistor which is set in an on state. When cell data is read from a memory cell, the bit line connected to the selected memory cell is charged from an input node (SAin) of the sense amplifier (108) via the column select transistor in an on state. When the selected memory cell is an off-bit and no current path is present from the bit line to the ground, the electric potentials at the input node (SAin) of the sense amplifier (108) and at the bit line connected to the selected memory cell are increased to a predetermined level by the charging operation of the charge circuit (106). The predetermined level is such a value obtained by subtracting the threshold value of the column select transistor from a gate potential of the column selection transistor. After the column select transistor has been switched from an on state to an off state, the input node (SAin) of the sense amplifier (108) is charged by the charge circuit (106). A read operation by the sense amplifier (108) is then performed, and an output the sense amplifier (108) is latched and output by a latch circuit (110) at a predetermined timing.

When the selected memory cell is an on-bit, and there is a current path from the bit line connected to the selected memory cell to the ground through the selected memory cell, potentials at the input node (SAin) of the sense amplifier and the bit line connected to the selected memory cell do not reach a predetermined level and remain Low even after the charging operation of the charge circuit (106).

In one mode of the present invention, a threshold value of the column select transistor may be set to be relatively high, and a time for the column select transistor to be turned off when a potential at the input node (SAin) of the sense amplifier (108) is raised may be shortened. Alternatively, a gate voltage of the column select transistor may be set to be relatively low and a time for the column select transistor to be turned off when the input node of the sense amplifier is charged and a potential at the input node of the sense amplifier is raised may be shortened.

Alternatively, in another mode of the present invention, the column select transistor may have a configuration in which a drain thereof is connected to the corresponding bit line, a source thereof is connected to the input node of the sense amplifier, and a gate thereof receives an output of a logic circuit that takes a logical product (AND) between a feedback signal (inverted value of a value on the bit line) on the bit line and a column select signal. A description will be given below in connection with exemplary embodiments.

An exemplary embodiment of the present invention will be described. A mask ROM will be described below, as the exemplary embodiment of the present invention. As described about an example of application to an SRAM in another exemplary embodiment, the present invention is not limited to the ROM. In fabrication, the mask ROM is so programmed that a case (represented by an on-bit) where current is flown through a transistor connected to a word line is set to a binary zero, and a case (represented by an off-bit) where current is not flown is set to a binary one, for example.

FIG. 1 is a diagram showing a configuration of a read circuit in a bit line system in the exemplary embodiment of the present invention. A memory cell includes NMOS transistor which has a source electrode grounded, a drain electrode connected to a bit line (also referred to as a "digit line"), and a gate electrode connected to a word line. At a time of manufacture, an on-bit memory cell (represented by an on-bit) and an off bit memory cells are programmed in the memory cells. In an on-bit memory cell, when the word line which is connected to a gate of an NMOS transistor of the on-bit memory cell is High, the NMOS transistor is turned on, and a drain to source current flows, and the drain electrode assumes a Low potential. In an off-bit memory cell, even when the word line is High, the NMOS transistor is in an off state.

Referring to FIG. 1, a discharge circuit 102 is provided in common to bit lines digit0, digit1, and so on. When a precharge signal (charge) is High, the discharge circuit 102 respectively discharges the bit lines digit0, digit1, and so on to a low potential.

A column selector 104 includes column select transistors (NMOS transistors) N0, N1, and so on with drains thereof respectively connected to the bit lines digit0, digit1, and so on and with sources thereof connected to an input node SAin of a sense amplifier 108. Column select signals column select0, column select1, and so on are respectively connected to gate electrodes of the column select transistors N0, N1, and so on. The column select signals column select0, column select1, and so on are output from a column decoder not shown, which decodes a column address. The column select transistors N0, N1, and so on are also referred to as column switches or Y switches.

The read circuit further includes a PMOS transistor 106 with a source thereof connected to a power supply terminal VDD and a drain thereof connected to the input node SAin of the sense amplifier 108. A gate of the PMOS transistor 106 receives the precharge signal (charge).

In this exemplary embodiment, the sense amplifier 108 has a single-ended input configuration rather than a differential type configuration, and is composed of a CMOS inverter circuit, for example.

A latch circuit 110 that receives an output of the sense amplifier 108 outputs an output of the sense amplifier 108 without alteration when a latch timing signal (latch timing) is deactivated. When the latch timing signal is activated, the latch circuit 110 holds the output of the sense amplifier 108 at that point.

In this exemplary embodiment, when the precharge signal (charge) is set to be High, the discharge circuit 102 is activated, thereby precharging (or discharging) the bit lines digit0, digit1, and so on to a GND potential. Then, the precharge signal (charge) is set to be Low, the discharge circuit 102 is deactivated, so that the bit lines digit0, digit 1, and so on are electrically disconnected from the GND potential. When the precharge signal (charge) is Low, the PMOS transistor 106 is turned on. Then, the PMOS transistor 106 charges the bit line connected to the drain of the column select transistor in an on state from the input node SAin of the sense amplifier 108, thereby raising potentials at the input node SAin and the bit line. A source potential (potential at the input node SAin) of the column select transistor (NMOS transistor) in the on state is increased. Then, a gate-to-source voltage of the column select transistor (NMOS transistor) is reduced to be less than or equal to a threshold value Vt. Then, after cutting off is performed, a read operation is performed. The sense amplifier 108 can be thereby configured to be single-ended.

Assume that the precharge signal (charge) is set to Low, and the PMOS transistor 106 in the on state charges the selected bit line from the side of the input node SAin of the sense amplifier 108 through the selected column select transistor. Then, when the cell to be read having a transistor with a gate thereof connected to the selected word line and a drain thereof connected to the selected bit line is an on-bit, the selected bit line is driven to a Low potential. The potential at the input node SAin of the sense amplifier 108 remains Low, and a Low output is output to an output terminal (Data-Out).

Assume that the cell to be read is an off-bit. Then, since there is no current path from the selected bit line to the GND, potentials at the input node SAin of the sense amplifier 108 and the selected bit line are increased by the charging operation of the PMOS transistor 106. For this reason, when the source potential of the selected column select transistor (such as N1) in the on state is increased, a gate-to-source voltage VGS of the column select transistor is reduced and becomes less than the threshold voltage Vt of the transistor column select N1 (VGS<Vt), as a result of which the column select transistor N1 is cut off. When the off-bit cell is read, the selected column select transistor is cut-off. Thus, in the read operation of an off-bit cell, the selected column select transistor is turned off in a short time, and the potential of the input node SAin of the sense amplifier is increased by the PMOS transistor 106 to a power supply voltage VDD with the input node SAin of the sense amplifier electrically disconnected from the selected bit line. Therefore, the sense amplifier 108 with the single-ended configuration can well determine read data of the selected memory cell.

Figure 2A:
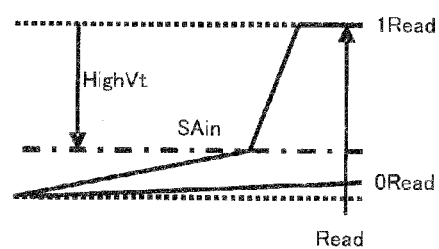
FIGS. 2A and 2B are waveform diagrams respectively explaining an operation of the exemplary embodiment of the present invention and an operation of a related art.

FIG. 2A is a graph showing a voltage waveform of an input to the input node SAin of the sense amplifier 108 at a time of data reading. At a time of 1 READ (High potential read: a read from an off bit cell), potentials at a selected bit line and the input node SAin of the sense amplifier 108 are increased owing to the charging operation of the PMOS transistor 106 which is turned on by the precharge signal (charge). When the potentials at the input node SAin and the selected bit line reach a voltage obtained by subtracting the threshold voltage Vt from a gate potential (such as the power supply voltage VDD) of the column select transistor in the on state, the selected column select transistor is turned off. Then, by the charging operation of the PMOS transistor 106, charging of the input node SAin of the sense amplifier 108 alone is performed. That is, as from a time point when the potential at the input node SAin reaches VDD–Vt, the slew rate of the rising voltage waveform at the input node SAin of the sense amplifier 108 is increased. When the column select transistor is cut off at an early point of time, a rise time to a High potential of the voltage waveform at the input node SAin of the sense amplifier 108 is shortened. In order to cut off the selected column select transistor at the early point of time, the selected column select transistors N0, N1, and so on are set to have a high threshold value (High Vt).

On the other hand, at a time of 0 READ (Low potential read: a read from an on-bit cell), current supplied to the selected bit line and the input node SAin of the sense amplifier 108 from the PMOS transistor 106 is flown to the GND through the on-bit cell. Then, the input node SAin and the selected bit line remain at a Low potential. An increase from the GND potential at the input node SAin by the charging operation of the PMOS transistor 106 is determined by a voltage dividing ratio between an on resistance of the PMOS transistor 106 and a sum of a bit line resistance and an on-bit cell resistance.

Figure 2B:
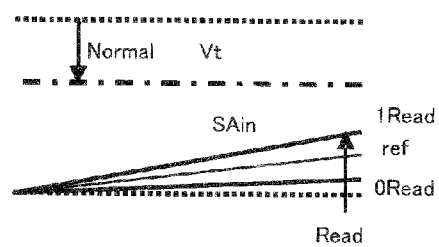

As shown in FIG. 2B, when the threshold value Vt of the column select transistor is normal (Normal Vt), potentials at the selected bit line and the input node SAin of the sense amplifier 108 are increased due to the charging operation of the PMOS transistor 106 at a time of 1READ (High potential read). However, the potentials at the selected bit line and the input node SAin of the sense amplifier 108 do not reach a voltage obtained by subtracting the threshold voltage Vt (normal Vt) from the gate voltage (supply voltage) of the selected column select transistor. Thus, the selected column select transistor remains to be turned on, so that the selected bit line and the input node SAin of the sense amplifier 108 are gently charged. In this case, the input node SAin of the sense amplifier 108 assumes a High potential. Thus, in order to perform amplification by the single-ended sense amplifier, a long time is needed. On the other hand, at a time of 0READ (Low potential read), current supplied from the PMOS transistor 106 to the selected bit line and the input node SAin of the sense amplifier 108 is flown to the GND through the on-bit selected cell. Thus, the selected bit line and the input node remain at a Low potential. An increase in the input node SAin from the GND potential is determined by a voltage-dividing resistance including the on resistance of the PMOS transistor 106, the bit line resistance, and the on-bit cell resistance.

FIG. 3 is a diagram showing timing waveforms indicating an operation in this exemplary embodiment shown in FIG. 1. Though no particular limitation is imposed, referring to FIG. 3, the sense amplifier 108 in FIG. 1 is composed of an inverter, and the latch circuit 110 inverts and outputs an output of the sense amplifier 108.

One of the column select signals column select0, column select1, and so on is selected. Word lines are selected in the order of word lines word0 and word1. When the precharge signal (charge) is High, entire bit lines are discharged to the Low potential by the discharge circuit 102.

The word line word0 is selected and set to High. Then, a memory cell M00 (off-bit) is selected. In a time interval during which the word line word0 is High, the precharge signal (charge) is set to Low. Then, the PMOS transistor 106 is turned on, and the input node SAin of the sense amplifier 108 and the bit line digit0 are charged by the PMOS transistor 106, thereby raising potentials at the input node SAID and the bit line digit0. Since the memory cell M00 is the off-bit, a potential at the input node SAin (source of the NMOS transistor N0) of the sense amplifier 108 is raised. When the gate-to-source voltage VGS of the selected column select transistor N0 becomes less than the threshold value Vt, the selected column select transistor N0 is turned off, and the slew rate of a rising waveform at the input node SAin of the sense amplifier 108 is increased to a High potential. An output SAout of the sense amplifier 108 is High when the potential at the input node SAin is less than a logical threshold value, and is Low when the potential at the input node SAin is more than or equal to the logical threshold value. The latch circuit 110 outputs the output SAout of the sense amplifier 108 to the data output terminal Data-Out when the latch timing (latch timing) signal is deactivated (at a time of a through mode). When the latch timing (latch timing) signal is activated, the latch circuit 110 latches a value of the output SAout of the sense amplifier 108 and outputs the latched value to the data output terminal Data-Out.

When the word line word0 goes Low from High, the precharge signal (charge) is set to be High. Then, entire bit lines are discharged to the Low potential. In this case, the input node SAin of the sense amplifier 108 is also discharged to the Low potential because the input node SAin is connected to the digit line digit0 through the column select transistor N0 in the on state.

Then, the column select signal column select1 is switched from Low to High with the precharge signal being High, the bit line digit1 is selected, the word line word1 is selected, and a memory cell M11 (on-bit) is selected. In a time interval during which the word line word1 is High, the precharge signal (charge) is set to Low. The PMOS transistor 106 is turned on, thereby charging the input node SAin of the sense amplifier 108 and the bit line digit1. Since the memory cell M11 is the on-bit current flows from the bit line through the cell transistor to the GND. An increase in the potential of the input node SAin is therefore slight. The gate-to-source voltage VGS of the selected column select transistor N1 is set to be greater than the threshold value Vt. The selected column select transistor N1 is thereby kept to be turned on. The potential at the input node SAin of the sense amplifier 108 is held Low, and the potential of the output SAout of the sense amplifier 108 is set to Low. The latch circuit 110 outputs the output SAout of the sense amplifier 108 (of the Low potential) to the data output terminal Data-Out when the latch timing (latch timing) signal is deactivated (at a time of the through mode). When the latch timing (latch timing) signal is activated, the latch circuit 110 latches the value of the output SAout of the sense amplifier 108 and outputs the latched value to the data output terminal Data-Out.

This arrangement according to this exemplary embodiment contributes reduction of the circuit area and power dissipation.

The sense amplifier 108 performs reading after the column select transistor in the column selector 104 has been turned off. The input node SAin of the sense amplifier is thereby amplified to the power supply potential VDD. Determination of read data by a CMOS inverter or the like thereby becomes possible. That is, a CMOS inverter may be employed as the sense amplifier 108.

The sense amplifier 108 in FIG. 1 may be of course of a two-stage inverter configuration (noninverting buffer) constituted from two stages of an inverter in an initial stage and an inverting buffer.

Further, the threshold value Vt of each of the column select transistors N0, N1, and so on in the column selector 104 may be set to a normal threshold value rather than a high threshold value, and a voltage of each of the column select signals (column select0, column select1, and so on) which is reduced from a normal logic high level by a predetermine voltage may be given to each of the column select transistors N0, N1, and so on. When a voltage at the input node SAin of the sense amplifier 108 (source voltage of the column select signal) exceeds a value obtained by subtracting the threshold value Vt from the gate voltage, each of the column select transistors N0, N1, and so on are turned off. By setting the threshold value Vt to the normal value and reducing the gate voltage, the voltage at the input node SAin of the sense amplifier 108 at which each of the column select transistors N0, N1, and so on is turned off can be lowered.

FIG. 4 is a diagram showing a configuration of a second exemplary embodiment of the present invention. In this exemplary embodiment, cutting off of a column select transistor in a column selector 104 is controlled by feeding back a bit line potential. As shown in FIG. 4, the second exemplary embodiment includes a logic circuit (AND circuit) 114 that takes a logical product (AND) between a signal obtained by inverting a signal on a bit line digit0 by an inverter 112 and a column select (column select) signal. An output of the logic circuit (AND circuit) 114 is supplied to a gate of a column select transistor N0. The same arrangement is used for other bit lines. A threshold value Vt of each of the column select transistors N0, column select transistors N1, and so on may be a normal threshold value.

Next, an operation of this exemplary embodiment shown in FIG. 4 will be described. When a precharge signal (charge) is High, entire bit lines are discharged to a GND potential. It is assumed that a column select signal column0 is High, a word line word0 is selected and set to High, and a memory cell M00 (off-bit) is selected. Since the column select signal column0 is High and the bit line digit0 is Low, an output of the AND circuit 114 goes High, and the column select transistor N0 is turned on. In a time interval during which the word line word0 is High, the precharge signal (charge) is set to Low. Then, a PMOS transistor 106 is turned on, and charges an input node SAin of a sense amplifier 108 and the bit line digit0, thereby raising potentials at these input node SAin and bit line digit0. Since the memory cell M00 is the off-bit, the potentials at the input node SAin (source of the NMOS transistor N0) of the sense amplifier 108 and the bit line digit0 are raised. When the potentials at the input node SAin and the bit line digit0 are raised to a High level, an output of an inverter 112 goes Low. Then, the output of the AND circuit 114 transitions from High to Low, and the column select transistor N0 is turned from on to off. Since the input node SAin of the sense amplifier 108 is charged by the PMOS transistor 106 with the column select transistor N0 turned off, the slew rate of a rising waveform at the input node SAin is increased to a High potential. A latch circuit 110 outputs an output SAout of the sense amplifier 108 to a data output terminal Data-Out when a latch timing signal (latch timing) is deactivated (at a time of a through mode). When the latch timing signal (latch timing) is activated, the latch circuit 110 latches a value of the output SAout of the sense amplifier 108, and outputs the latched value to the data output terminal Data-Out.

Next, it is assumed that the column select signal column1 is High, a word line word1 is selected to go High, and a memory cell M11 (on-bit) is selected. When the precharge signal (charge) is High, entire bit lines are discharged to the GND potential. Since the column select signal column1 is High and a bit line digit1 is Low, an output of an AND circuit 118 connected to a gate of the column select transistor N1 goes High, and the column select transistor N1 is turned on. In a time interval during which the word line word1 is High, the precharge signal (charge) is set to Low. The PMOS transistor 106 is turned on and charges the input node SAin of the sense amplifier 108 and the bit line digit1, thereby raising potentials at these input node SAin and bit line digit1. Since the memory cell M11 is the on-bit, the potentials at the input node SAin (source of the NMOS transistor N1) of the sense amplifier 108 and the bit line digit1 are held Low. An output of an inverter 116 that receives the bit line digit1 remains High. Then, the output of the AND circuit 118 is held High, the column select transistor N1 is kept to be in an on state, and the potential at the input node of the sense amplifier 108 is set to Low. When the latch timing signal (latch timing) is deactivated (at the time of the through mode), the latch circuit 110 outputs the output SAout of the sense amplifier 108 is to the data output terminal Data-Out. When the latch timing signal (latch timing) is activated, the latch circuit latches a value of the output SAout of the sense amplifier 108 and outputs the latched value to the data output terminal Data-out.

In this exemplary embodiment, the inverters 112, 116, and so on may be so configured that logic threshold values of the inverters 112, 116, and so on with inputs respectively thereof connected to the bit lines digit0, digit1, and so on are set to be low, and each of the inverters 112, 116, and so on outputs a Low output at a point of time when each of the bit lines digit0, digit1, and so on has risen to a predetermined potential from the GND potential. A timing at which each of the column select transistors N0, N1, and so on is cut off may be thereby quickened.

Referring to FIG. 4, to the inverters 112 and 116, the input node SAin of the sense amplifier 108 may be connected, in place of the bit lines digit0 and digit1.

Figure 5:
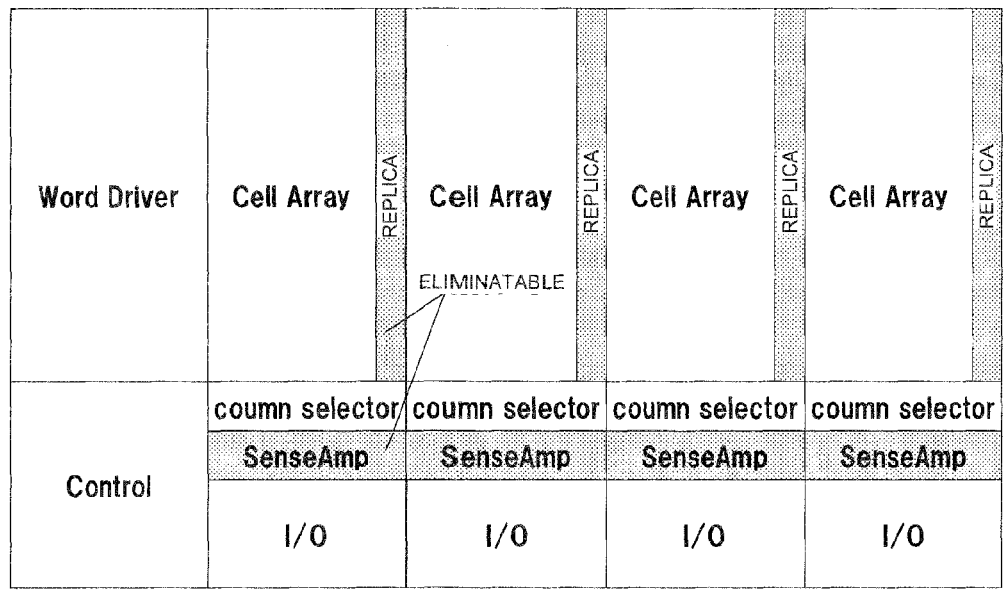
FIG. 5 is a diagram explaining circuit areas of the present invention and the related art.
Figure 7:
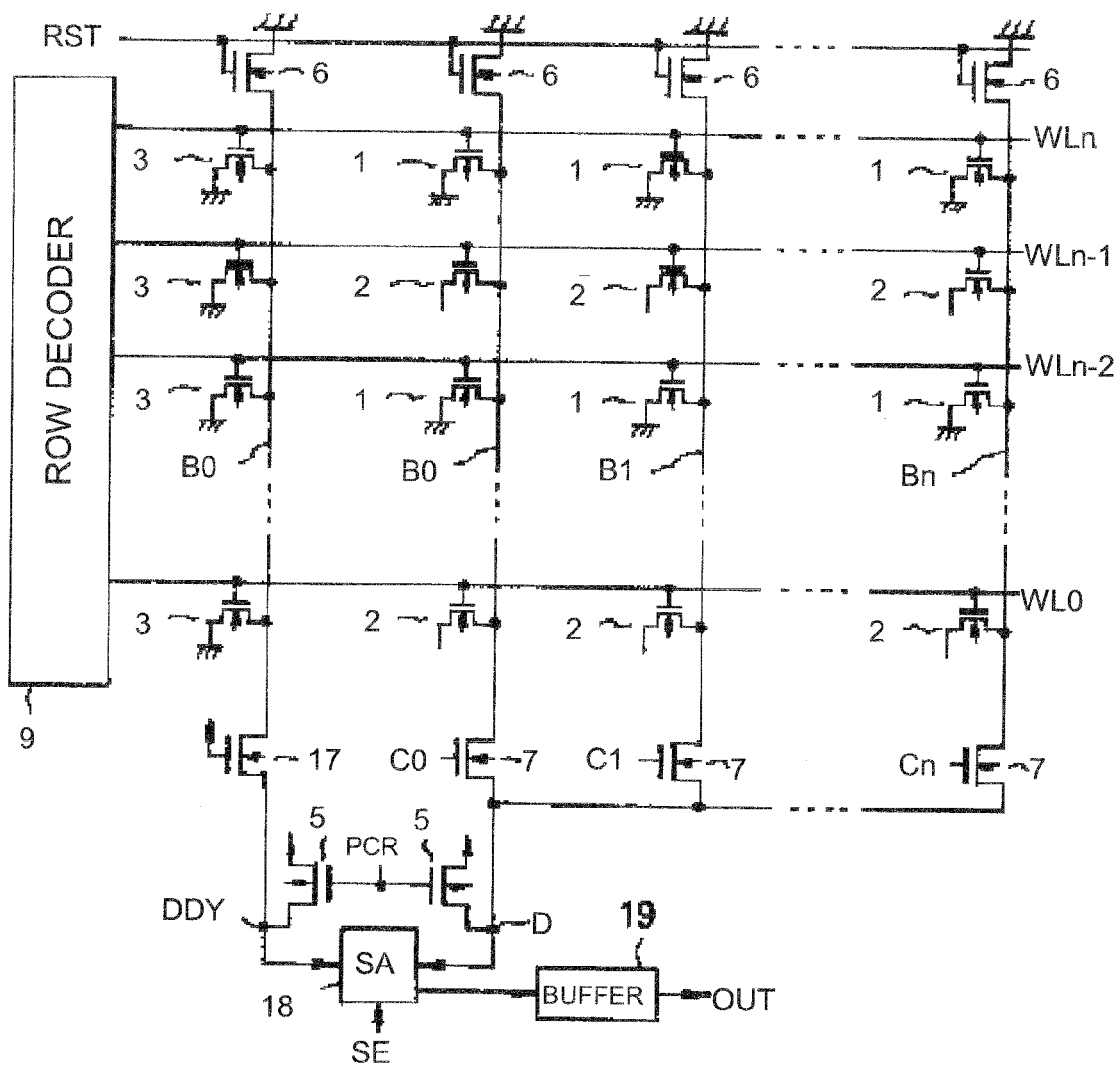
FIG. 7 is a diagram showing a configuration of the related art.
Figure 8:
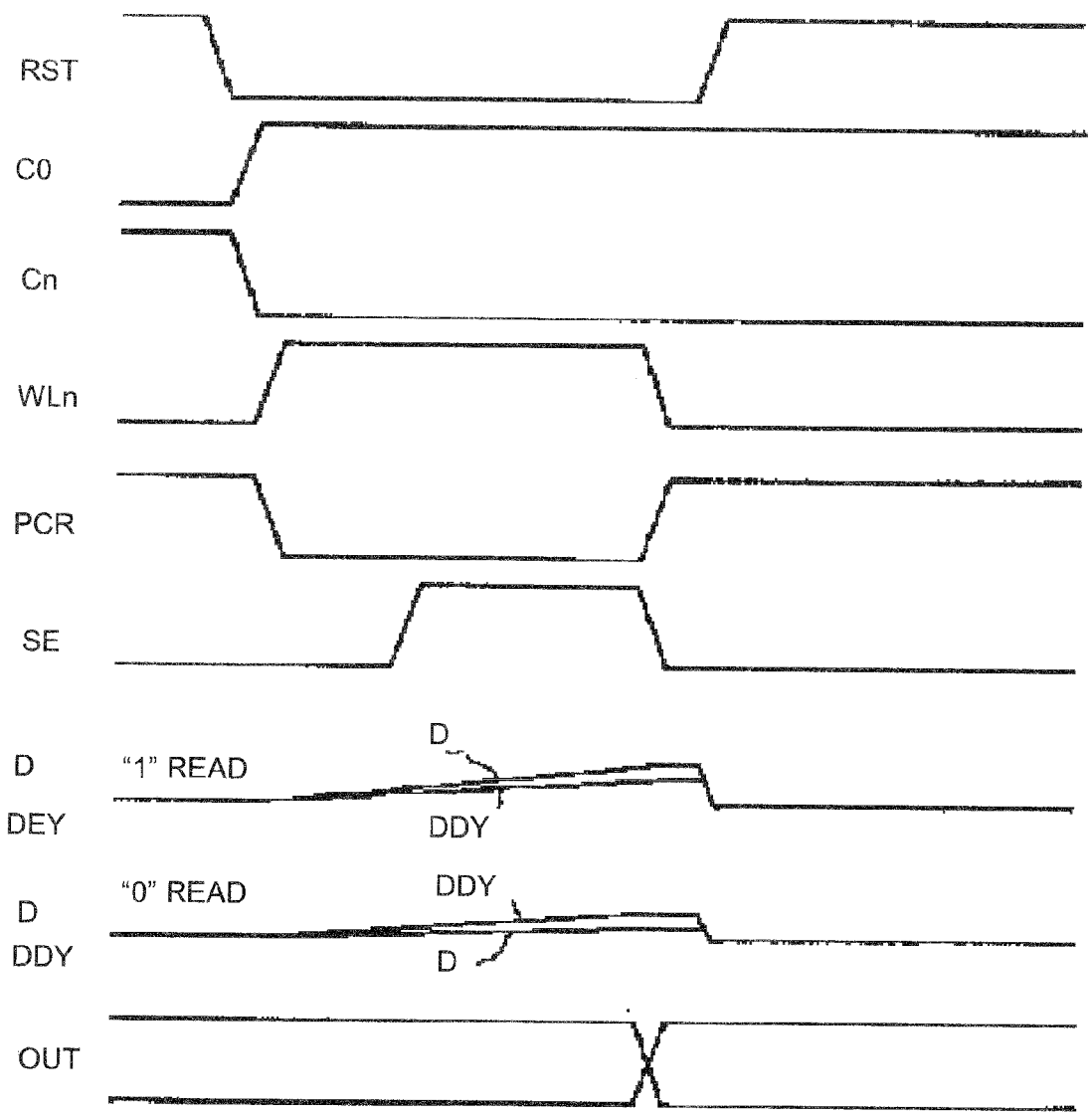
FIG. 8 is a timing waveform diagram explaining the operation of the related art.

FIG. 5 is a diagram for comparing a related art described with reference to FIGS. 7 and 8 with the present invention, for explanation. According to this exemplary embodiment, the node SAin is set to have a High or Low logic level at times of a 1Read (High potential read) and a 0READ (Low potential read). Accordingly, a replica circuit for a reference signal and differential sense amplifiers, both needed in the related art become unnecessary, and the area for wiring can be thereby greatly reduced.

Power to be used in the replica circuit can be dispensed. Further, after one of the column select transistors has been turned off, no electric charge is injected into the selected bit line. Thus, power dissipation at the selected bit line can also be reduced.

The present invention can also be of course applied to a read circuit of an electrically erasable and programmable memory (EEPROM) dedicated for reading or the like, as well as a mask ROM.

Figure 6:
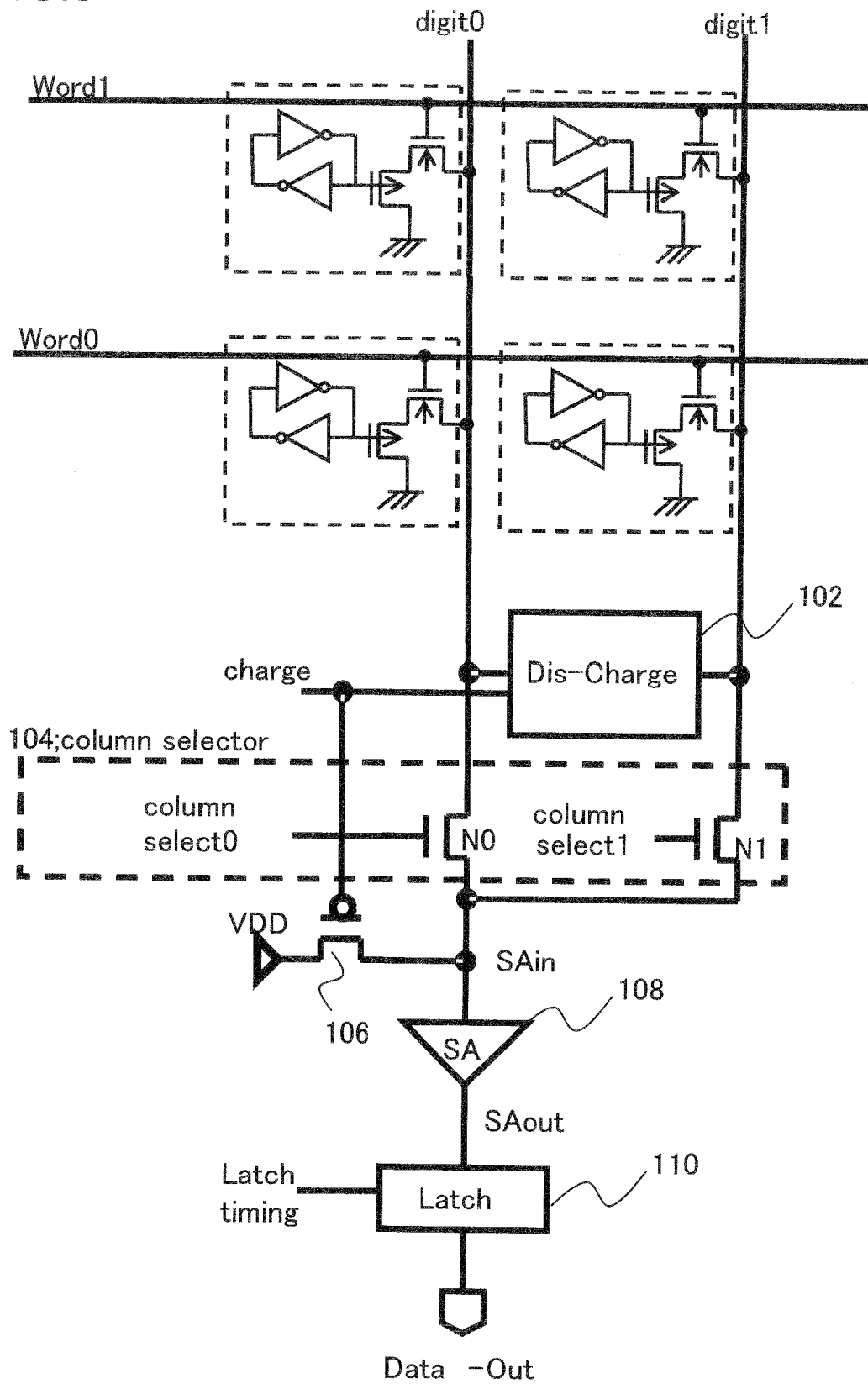
FIG. 6 is a diagram explaining a configuration in which the present invention has been applied to a multiport RAM.

As shown in FIG. 6, the present invention can also be applied to a read circuit of a multiport SRAM having write and read ports. When a word line goes High at a time of reading a memory cell in which data 1 has been written, a corresponding bit line is driven to a Low potential. That is, a current flows from a PMOS transistor 106 to GND via a selected column select transistor through the corresponding bit line and the selected memory cell. When a memory cell in which data 0 has been written is read, the memory cell is in an off state (off-bit) even if the word line goes High, In this case, due to a charging operation to a High potential from the PMOS transistor 106, a selected column select transistor is turned off. Then, only the node SAin is charged, and a High Data-Out output is output from an output terminal.

A variation cancelling circuit that adjusts variations in the threshold value Vt among the column select transistors N0, N1, and so on may be provided in each of the exemplary embodiments described above.

The disclosure of Patent Document 1 described above is incorporated herein by reference. Modifications and adjustments of the exemplary embodiment and the exemplary embodiments are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the basic technical concept.

What is claimed is:

1. A semiconductor memory device comprising:
    a plurality of word lines and a plurality of bit lines;
    a plurality of memory cells arranged at intersections of the bit lines and the word lines;
    a plurality of column select transistors having first terminals thereof connected to the plurality of bit lines, respectively, having second terminals thereof coupled in common, and having control terminals thereof, respectively supplied with a plurality of column select signals, each column select transistor being controlled to be turned on and off by associated column select signal;
    a sense amplifier having an input node connected to the commonly coupled second terminals of the column select transistors;
    a discharge circuit that discharges the plurality of bit lines responsive to a control signal supplied thereto; and a charge circuit that has an output connected to the input node of the sense amplifier and, responsive to the control signal, charges the bit line via the column select transistor which is selected and turned on;

the plurality of bit lines being discharged to a ground potential by the discharge circuit in a predetermined time interval different from a time interval during which a selected word line is activated, wherein in a read operation of the memory cell, the bit line connected to a selected memory cell is charged from a side of an input node of the sense amplifier by the charge circuit via the column select transistor that is turned on, when the input node of the sense amplifier and the bit line are charged by the charge circuit to a predetermined potential, the selected column select transistor that connects the bit line connected to the selected memory cell to the input node of the sense amplifier is turned off, then after, the input node of the sense amplifier is charged by the charge circuit with the selected column select transistor being turned off and with the bit line connected to the memory cell electrically disconnected from the input node of the sense amplifier, and the reading is performed by the sense amplifier, based on a result of the charging of the input node thereof.

2. The semiconductor memory device according to claim 1, wherein
the sense amplifier has a single-ended input configuration.

3. The semiconductor memory device according to claim 1, wherein
the column select transistor includes a MOS transistor receiving a column select signal at a gate thereof, having a drain thereof connected to an associated bit line, and having a source thereof connected to the input node of the sense amplifier,
when a potential at the input node of the sense amplifier is increased by the charging operation of the charge circuit, and exceeds the potential obtained by subtracting a threshold value of the MOS transistor from a gate-to-source voltage of the MOS transistor, the MOS transistor is turned off, and
the threshold value of the MOS transistor is set to be relatively high.

4. The semiconductor memory device according to claim 1, wherein
the column select transistor includes a MOS transistor having a drain thereof connected to an associated bit line, having a source thereof connected to the input node of the sense amplifier, and receiving a result of a logical operation on a feedback signal on the one of the bit lines and the column select signal.

5. The semiconductor memory device according to claim 1, wherein
the charge circuit is connected between a power supply terminal and the input node of the sense amplifier, the charge circuit comprising a transistor that is controlled to be turned on and off responsive to a control signal for controlling the charging operation.

6. A semiconductor memory device comprising:
a discharge circuit that discharges bit lines to a ground potential, responsive to a control signal supplied thereto;
a sense amplifier of a single-ended input configuration; and
a charge circuit that charges selected bit line from a side of an input node of the sense amplifier via a selected column select transistor being set to an on state, responsive to the control signal; wherein
when a memory cell is read, the bit line connected to a selected memory cell being charged by the charge circuit from a side of the input node of the sense amplifier via the selected column select transistor being set to an on state, and when the memory cell is an off-bit and there is no current path to a ground, the input node of the sense amplifier and the one of the bit lines being increased to a predetermined potential due to the charging operation of the charge circuit, and after the column select transistor has been switched from an on state to an off state, the input node of the sense amplifier being charged by the charge circuit and then the reading operation being performed.

7. The semiconductor memory device according to claim 1, wherein
a threshold value of the column select transistor is set to be relatively high, and
a time for the column select transistor to be turned off, when a potential at the input node of the sense amplifier is raised, is shortened.

8. The semiconductor memory device according to claim 6, wherein
a threshold value of the column select transistor is set to be relatively high, and
a time for the column select transistor to be turned off, when a potential at the input node of the sense amplifier is raised, is shortened.

9. The semiconductor memory device according to claim 1, wherein
a gate voltage of the column select transistor is set to be relatively low; and
a time for the column select transistor to be turned off when the input node of the sense amplifier is charged and a potential at the sense amplifier input node is increased is shortened.

10. The semiconductor memory device according to claim 6, wherein
a gate voltage of the column select transistor is set to be relatively low; and
a time for the column select transistor to be turned off when the input node of the sense amplifier is charged and a potential at the sense amplifier input node is increased is shortened.

11. The semiconductor memory device according to claim 6, wherein
the column select transistor has a drain thereof connected to an associated bit line and a source thereof connected to the input node of the sense amplifier, and
a gate of the column select transistor receives an output of a logic circuit that takes a logical product between an inverted value of a value on the bit line and a column select signal.

12. The semiconductor memory circuit according to claim 6, wherein
the charge circuit is deactivated when the discharge circuit is activated to discharge the bit lines to the ground potential based on the control signal; and
the discharge circuit is deactivated when the charge circuit is activated to charge the input node of the sense amplifier based on the control signal.

13. The semiconductor memory device according to claim 12, wherein
the charge circuit comprises a transistor connected between a power supply terminal and the input node of the sense amplifier and controlled to be on or off responsive to the control signal.

* * * * *